(12) United States Patent
Fisher

(10) Patent No.: US 12,212,289 B2
(45) Date of Patent: Jan. 28, 2025

(54) GROUP III NITRIDE BASED DEPLETION MODE DIFFERENTIAL AMPLIFIERS AND RELATED RF TRANSISTOR AMPLIFIER CIRCUITS

(71) Applicant: MACOM Technology Solutions Holdings, Inc., Lowell, MA (US)

(72) Inventor: Jeremy Fisher, Raleigh, NC (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 530 days.

(21) Appl. No.: 17/547,573

(22) Filed: Dec. 10, 2021

(65) Prior Publication Data

US 2023/0188100 A1 Jun. 15, 2023

(51) Int. Cl.
*H03F 3/193* (2006.01)
*H01L 29/20* (2006.01)
(Continued)

(52) U.S. Cl.
CPC ......... *H03F 3/193* (2013.01); *H01L 29/2003* (2013.01); *H01L 29/7786* (2013.01);
(Continued)

(58) Field of Classification Search
CPC .... H03F 3/193; H03F 1/0211; H03F 3/45273; H03F 2200/222; H03F 2200/318; H03F 2200/387; H03F 2200/451; H03F 1/22; H03F 2200/108; H03F 2200/21; H03F 2200/42; H03F 2200/48; H03F 2200/54; H03F 2200/555; H03F 2203/45528; H03F 2203/45594; H03F 2203/45601; H03F 2203/45638; H03F 2203/45698; H03F 2203/45701; H03F 1/30; H03F 1/56;
(Continued)

(56) References Cited

U.S. PATENT DOCUMENTS 9,276,529 B1    3/2016  Brown et al.
9,595,928 B2 *  3/2017  Schmukler .............. H03F 1/306
(Continued)

OTHER PUBLICATIONS

"International Search Report and Written Opinion for International Application No. PCTUS22080727 dated Apr. 12, 2023, 20 pages".
(Continued)

*Primary Examiner* — Hieu P Nguyen
(74) *Attorney, Agent, or Firm* — Myers Bigel, P.A.

(57) ABSTRACT

An RF transistor amplifier circuit comprises a Group III nitride based RF transistor amplifier having a gate terminal, a Group III nitride based self-bias circuit that includes a first Group III nitride based depletion mode high electron mobility transistor, the Group III nitride based self-bias circuit configured to generate a bias voltage, and a Group III nitride based depletion mode differential amplifier that is configured to generate an inverted bias voltage from the bias voltage and to apply the inverted bias voltage to the gate terminal of the Group III nitride based RF transistor amplifier. The Group III nitride based RF transistor amplifier, the Group III nitride based self-bias circuit and the Group III nitride based depletion mode differential amplifier are all implemented in a single die.

20 Claims, 9 Drawing Sheets

(51) Int. Cl.
  *H01L 29/778* (2006.01)
  *H03F 1/02* (2006.01)
  *H03F 3/45* (2006.01)
  *H01L 23/00* (2006.01)
  *H01L 23/047* (2006.01)
  *H01L 23/373* (2006.01)

(52) U.S. Cl.
  CPC ....... *H03F 1/0211* (2013.01); *H03F 3/45273* (2013.01); *H01L 23/047* (2013.01); *H01L 23/3735* (2013.01); *H01L 24/48* (2013.01); *H01L 2224/48137* (2013.01); *H01L 2224/48175* (2013.01); *H03F 2200/222* (2013.01); *H03F 2200/318* (2013.01); *H03F 2200/387* (2013.01); *H03F 2200/451* (2013.01)

(58) Field of Classification Search
  CPC .... H03F 3/45188; H03F 3/45475; H03F 3/50; H03F 3/195; H01L 29/2003; H01L 29/7786; H01L 23/047; H01L 23/3735; H01L 24/48; H01L 2224/48137; H01L 2224/48175
  USPC .................................. 330/277, 285, 296, 307
  See application file for complete search history.

(56) References Cited

U.S. PATENT DOCUMENTS

| | | |
|---|---|---|
| 10,516,043 B1 | 12/2019 | Sriram et al. |
| 2017/0019069 A1* | 1/2017 | Dunsmore ............ H03F 1/0222 |
| 2017/0033749 A1* | 2/2017 | Schmukler ................ H03F 3/21 |

OTHER PUBLICATIONS

Basler, Michael, et al., "A GaN-based Current Sense Amplifier for GaN HEMTs with Integrated Current Shunts", 32nd International Symposium on Power Semiconductor Devices and ICS (ISPSD, 2020, 274-277).

"Lawrence E. Larson et al., "An Ultrahigh-Speed GaAs MESFET Operational Amplifier," IEEE Journal of Solid-State Circuits, vol. 24, No. Dec. 6, 1989".

* cited by examiner

GROUP III NITRIDE BASED DEPLETION MODE DIFFERENTIAL AMPLIFIERS AND RELATED RF TRANSISTOR AMPLIFIER CIRCUITS

FIELD

The present invention relates to microelectronic devices and, more particularly, to Group III nitride based differential amplifiers and radio frequency ("RF") transistor amplifiers including such differential amplifiers.

BACKGROUND

Power semiconductor devices that are capable of carrying large currents and/or of blocking high voltages while operating at high frequencies, such as R-band (0.5-1 GHz), S-band (3 GHz), X-band (10 GHz), Ku-band (12-18 GHz), K-band (18-27 GHz), Ka-band (27-40 GHz) and V-band (40-75 GHz) have become more prevalent. In particular, there is now high demand for power semiconductor devices such as RF transistor amplifiers that operate on RF signals at frequencies of, for example, 500 MHz and higher (as used herein, the term "RF" encompasses microwave frequencies). These RF transistor amplifiers often need to exhibit high reliability, good linearity and handle high output power levels.

Power semiconductor devices are typically implemented in silicon or wide bandgap semiconductor materials, such as silicon carbide ("SiC") and Group III nitride materials. Herein, the term "wide bandgap" refers to semiconductor materials having a bandgap of greater than 1.40 eV. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of Group III elements. Group III nitride materials that include gallium are referred to as gallium nitride based materials and include, for example, GaN, AlGaN and AlInGaN.

RF transistor amplifiers and various other power semiconductor devices are often implemented using high electron mobility transistors. High electron mobility transistors refer to semiconductor devices that include at least a semiconductor channel layer, a semiconductor barrier layer on the channel layer, and source, drain and gate terminals. When appropriate voltages are applied to the source, drain and gate terminals, a difference in the bandgaps of the channel and barrier layers generates piezoelectric effects at the interface between the barrier layer and the channel layer that induces a two dimensional electron gas (2DEG) at this interface. The 2DEG acts as a highly conductive layer that allows conduction between the source and drain regions of the transistor (and hence between the source and drain terminals). High electron mobility transistors may be classified into depletion mode and enhancement mode types, corresponding to whether the transistor is in an ON-state or an OFF-state at a gate voltage of zero volts. In enhancement mode devices, the transistor is OFF (non-conducting) at a gate voltage of zero volts, whereas in depletion mode devices, the transistor is ON (conducting) at a gate voltage of zero volts. High electron mobility transistors are typically depletion mode devices, in that they are conductive at a gate bias voltage of zero volts due to a polarization-induced charge at the interface of the channel and barrier layers.

Modern high-power Group III nitride based RF transistor amplifiers may include one or more amplification stages, with each amplification stage typically implemented using depletion mode high electron mobility based transistors. The amplification stages may be electrically connected in series and/or in parallel, and may or may not include pre-amplification stages. In order to increase the output power and current handling capabilities, RF transistor amplifiers are typically implemented as a large number of individual "unit cell" transistors that are arranged electrically in parallel. RF transistor amplifiers also often include matching circuits, such as (1) impedance matching circuits that are designed to improve the impedance match (for RF signals at the fundamental operating frequency of the amplifier) between the RF transistor amplifier and transmission lines connected thereto and (2) harmonic termination circuits that are designed to at least partly terminate harmonics that may be generated during device operation, such as second and third order harmonics or baseband intermodulation products. These RF transistor amplifiers may be implemented using a plurality of discrete dies (e.g., a separate die for each amplification stage and matching circuit) or may alternatively by implemented as a Monolithic Microwave Integrated Circuit (MMIC) in which all of the circuit structures are formed on a common die.

SUMMARY

Pursuant to embodiments of the present invention, RF transistor amplifier circuits are provided that comprise a Group III nitride based RF transistor amplifier having a gate terminal, a Group III nitride based self-bias circuit that includes a first Group III nitride based depletion mode high electron mobility transistor, the Group III nitride based self-bias circuit configured to generate a bias voltage, and a Group III nitride based depletion mode differential amplifier that is configured to generate an inverted bias voltage from the bias voltage and to apply the inverted bias voltage to the gate terminal of the Group III nitride based RF transistor amplifier, where the Group III nitride based RF transistor amplifier, the Group III nitride based self-bias circuit and the Group III nitride based depletion mode differential amplifier are all implemented in a single die.

In some embodiments, the Group III nitride based RF transistor amplifier may include a second Group III nitride based depletion mode high electron mobility transistor, and the first and second Group III nitride based depletion mode high electron mobility transistors may have substantially the same threshold voltage.

In some embodiments, the differential amplifier may have an inverting input that is coupled to an output of the self-bias circuit and an output that is coupled to a gate of the second Group III nitride based depletion mode high electron mobility transistor.

In some embodiments, the Group III nitride based RF transistor amplifier may further include a third Group III nitride based depletion mode high electron mobility transistor, and the output of the self-bias circuit is also connected to a gate of the third Group III nitride based depletion mode high electron mobility transistor.

In some embodiments, the self-bias circuit may be configured to mirror a current in the second Group III nitride based depletion mode high electron mobility transistor and to provide a bias voltage to the gate of the second Group III nitride based depletion mode high electron mobility transistor based on the current that is mirrored.

In some embodiments, the RF transistor amplifier may further comprise an RF input terminal that is connected to the gate of the second Group III nitride based depletion mode high electron mobility transistor.

In some embodiments, the Group III nitride based depletion mode differential amplifier may include an RF depletion mode high electron mobility transistor and the first Group III nitride based depletion mode high electron mobility transistor may comprise an analog high electron mobility transistor.

In some embodiments, a gate of the first Group III nitride based depletion mode high electron mobility transistor may be coupled to a reference voltage.

In some embodiments, the Group III nitride based self-bias circuit may further include a current setting circuit that is connected to a source of the first Group III nitride based depletion mode high electron mobility transistor.

In some embodiments, the Group III nitride based depletion mode differential amplifier may be a unity gain differential amplifier.

Pursuant to further embodiments of the present invention, differential amplifiers are provided that comprise a differential amplifier stage that includes a plurality of Group III nitride based depletion mode high electron mobility transistors, a level shifter stage that includes a plurality of Group III nitride based depletion mode high electron mobility transistors, an output buffer stage that includes a plurality of Group III nitride based depletion mode high electron mobility transistors, and a current source stage that includes a plurality of Group III nitride based depletion mode high electron mobility transistors.

In some embodiments, the current source stage may be configured to supply current to each of the differential amplifier stage, the level shifter stage and the output buffer stage.

In some embodiments, the plurality of Group III nitride based depletion mode high electron mobility transistors in the differential amplifier stage may comprise first, third and fifth Group III nitride based depletion mode high electron mobility transistors that are coupled in series between the current source stage and a power supply voltage and second, fourth and sixth Group III nitride based depletion mode high electron mobility transistors that are coupled in series between the current source stage and a power supply voltage.

In some embodiments, a non-inverting input of the differential amplifier may be coupled to the gate of the first Group III nitride based depletion mode high electron mobility transistor, and an inverting input of the differential amplifier may be coupled to the gate of the second Group III nitride based depletion mode high electron mobility transistor.

In some embodiments, a portion of the current source stage that supplies current to the level shifter stage may be coupled to the level shifter stage through a gate of a transistor in the output buffer stage.

In some embodiments, a first transistor in the level shifter stage may be coupled to a diode of the level shifter stage though a gate of a transistor in the output buffer stage.

In some embodiments, any of the above-described differential amplifiers may be provided in combination with a Group III nitride based self-bias circuit and a Group III nitride based RF transistor amplifier, where the Group III nitride based self-bias circuit, the differential amplifier and the Group III nitride based RF transistor amplifier are formed on a common semiconductor die.

In some embodiments, the Group III nitride based self-bias circuit may include a first Group III nitride based depletion mode high electron mobility transistor, the Group III nitride based self-bias circuit may be configured to generate a bias voltage, and the differential amplifier may be configured to generate an inverted bias voltage from the bias voltage and to apply the inverted bias voltage to a gate terminal of the Group III nitride based RF transistor amplifier that includes a second Group III nitride based depletion mode high electron mobility transistor.

In some embodiments, the first and second Group III nitride based depletion mode high electron mobility transistors may have substantially the same threshold voltage.

In some embodiments, the differential amplifier has an inverting input that is coupled to an output of the self-bias circuit and an output that is coupled to a gate of the second Group III nitride based depletion mode high electron mobility transistor.

DETAILED DESCRIPTION

Figure 1:
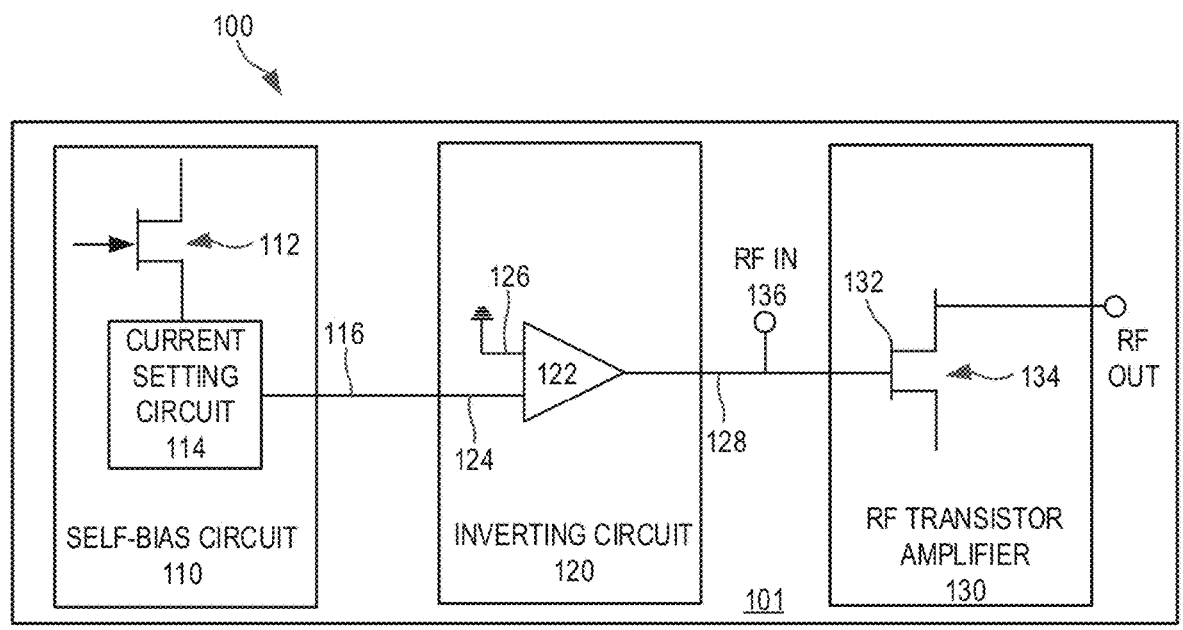
FIG. 1 is block diagram of an RF transistor amplifier circuit according to embodiments of the present invention.

As discussed above, RF transistor amplifiers are often implemented using depletion mode Group III nitride based high electron mobility transistors. Unfortunately, the threshold voltage of depletion mode Group III nitride based high electron mobility transistors may vary as a result of process variations during manufacturing. Thus, even when a plurality of RF transistor amplifiers are grown on a single wafer, the threshold voltages of the individual RF transistor amplifiers may vary significantly. Additionally, the threshold voltage of a Group III nitride based high electron mobility transistor may also vary during operation based on, for example, the temperature of the device.

Many modern communications systems require linear amplification. A Group III nitride based depletion mode high electron mobility transistor may exhibit the best linearity when biased just above the threshold voltage. Similarly, other high power RF systems such as RADAR systems may require matched gain, power and/or phase performance, which may be optimized by biasing parallel transistors to similar conditions, which may require different gate voltages that are dependent on the specific threshold voltage of each transistor. Most communication systems and other RF systems, however, are designed to apply a fixed gate bias voltage to the RF transistor amplifiers included therein in order to simplify the design of the bias circuitry. Thus, variations in the threshold voltage due to manufacturing, temperature or the like can result in reduced linearity or mismatched performance since these variations may move the gate bias voltage away from the optimum value.

The manufacturing-based variations in threshold voltage may be compensated for by individually tuning the gate bias voltage for each RF transistor amplifier to keep the gate bias voltage in the range that provides the best linearity. Alternatively, each RF transistor amplifier may be individually tested after manufacture and then sorted or "binned" in order to group devices that have similar threshold voltages. The RF transistor amplifiers in each group or "bin" are then used in higher level RF systems that supply gate bias voltages within predetermined ranges corresponding to the optimum gate bias voltage for the RF transistor amplifiers in the respective bins. These tuning or binning techniques, however, may be costly and may not be amenable to high volume production. Moreover, these approaches do not compensate for variations in the threshold voltage that may occur during operation, such as temperature-based variations.

Another approach for compensating for manufacturing and operation-based variations in the threshold voltage of an RF transistor amplifier is to provide a self-bias circuit that automatically adjusts the gate bias voltage that is applied to the RF transistor amplifier to a level that provides good linearity. Such an approach is disclosed in U.S. Pat. No. 9,595,928 ("the '928 patent"), the entire content of which is incorporated herein by reference.

As discussed in the '928 patent, RF transistor amplifier circuits may be provided that include a self-bias circuit, an inverting circuit and an RF transistor amplifier. The self-bias circuit may include a first Group III nitride based depletion mode high electron mobility transistor, and the RF transistor amplifier may include a second Group III nitride based depletion mode high electron mobility transistor that has substantially the same electrical and thermal characteristics, such as substantially the same threshold voltage, as the first Group III nitride based depletion mode transistor in the self-bias circuit. This may be accomplished, for example, by forming the first Group III nitride based depletion mode high electron mobility transistor of the self-bias circuit on the same semiconductor die, and in close proximity to, the second Group III nitride based depletion mode high electron mobility transistor that is used to implement the RF transistor amplifier, since closely located transistors on a semiconductor die tend to have very similar electrical and thermal characteristics. The self-bias circuit is configured to mirror a current in the RF transistor amplifier, and to generate an output voltage based on the current that is mirrored. The output voltage from the self-bias circuit is fed to the inverting circuit. The inverting circuit is configured to generate a gate bias voltage for the RF transistor amplifier by inverting the output voltage of the self-bias circuit. The gate bias voltage output by the inverting circuit is applied to a gate of the RF transistor amplifier. This arrangement thus uses a negative current mirror to generate a gate bias voltage for the RF transistor amplifier that provides a predetermined constant current in the second Group III nitride based depletion mode high electron mobility transistor thereof that is relatively independent of process variations and/or temperature. This is accomplished by using the self-bias and inverting circuits to vary the gate bias voltage applied to the RF transistor amplifier to keep the current constant.

The inverting circuits that are included in the RF transistor amplifier circuits of the '928 patent may be implemented using an operational amplifier and resistors. As shown in FIG. 9 of the '928 patent, the depletion mode high electron mobility RF transistor amplifier and the self-bias circuit may be implemented on a first semiconductor die and the operational amplifier and associated resistors may be implemented on a second semiconductor die. The '928 patent also states that the operational amplifier can be implemented on the same semiconductor die as the depletion mode high electron mobility RF transistor amplifier and the self-bias circuit. However, operational amplifiers are not available that are implemented solely using Group III nitride based depletion mode high electron mobility transistors, and it can be commercially impractical to form both enhancement mode and depletion mode high electron mobility transistors on the same semiconductor die. As a result, in practice, Group III nitride based RF transistor amplifier circuits having the design of the '928 patent are implemented using a first semiconductor die for the depletion mode high electron mobility RF transistor amplifier and the self-bias circuit and a second semiconductor die for the operational amplifier. The second semiconductor die is typically implemented as a silicon based semiconductor circuit.

Pursuant to embodiments of the present invention, Group III nitride based RF transistor amplifier circuits are provided that include an RF transistor amplifier, a self-bias circuit and an inverting circuit that are all implemented on a common semiconductor die with all of the Group III nitride based high electron mobility transistors implemented as depletion mode transistors. Such a design avoids any need to implement the RF transistor amplifier and the inverting circuit on separate semiconductor dies. As such, the RF transistor amplifier circuit according to embodiments of the present invention may exhibit reduced size and cost, and connections to external control circuits may be reduced or eliminated. Additionally, implementing the inverting circuit on the same semiconductor die as the RF transistor amplifier allows for direct (and hence much shorter) interconnections between the self-bias circuit, the inverting circuit and the RF transistor amplifier, and may reduce or eliminate the need for bond pads, bond wire connections and the like for interconnecting these circuit elements. This may further reduce the size and cost of the RF transistor amplifier circuit.

In some embodiments, the RF transistor amplifier circuits may be implemented as discrete devices that only include one or more RF transistor amplifiers along with a self-bias circuit and an inverting circuit that are used to adjust the gate bias voltage(s) supplied to the RF transistor amplifier(s). In other embodiments, the RF transistor amplifier circuits may be implemented as MMIC devices that further include other circuit elements such as impedance matching and/or harmonic termination circuits. In either case, the RF transistor amplifier circuits may be packaged using a variety of different packaging technologies, as will be discussed in detail below.

In some embodiments, RF transistor amplifier circuits are provided that comprise a Group III nitride based RF transistor amplifier, a self-bias circuit that includes a first Group III nitride based depletion mode high electron mobility transistor, and a Group III nitride based depletion mode differential amplifier. The Group III nitride based self-bias circuit is configured to generate a bias voltage, and the Group III nitride based depletion mode differential amplifier is configured to generate an inverted bias voltage from the bias voltage and to apply the inverted bias voltage to a gate terminal of the Group III nitride based RF transistor amplifier. The Group III nitride based RF transistor amplifier, the Group III nitride based self-bias circuit and the Group III nitride based depletion mode differential amplifier are all implemented in a single semiconductor die.

In some embodiments, the Group III nitride based RF transistor amplifier may include a second Group III nitride based depletion mode high electron mobility transistor, and the first and second Group III nitride based depletion mode high electron mobility transistors may have substantially the same threshold voltage. The differential amplifier may have an inverting input that is coupled to an output of the self-bias circuit and an output that is coupled to a gate of the second Group III nitride based depletion mode high electron mobility transistor. The Group III nitride based RF transistor amplifier may further include one or more additional Group III nitride based depletion mode high electron mobility transistors, and the output of the self-bias circuit may also be connected to gates of these additional Group III nitride based depletion mode high electron mobility transistors.

In some embodiments, the self-bias circuit may be configured to mirror a current in the second Group III nitride based depletion mode high electron mobility transistor of the RF transistor amplifier and to provide a bias voltage to the gate of the second Group III nitride based depletion mode high electron mobility transistor based on the current that is mirrored. In some embodiments, the Group III nitride based depletion mode differential amplifier may be an RF depletion mode high electron mobility transistor, while the first Group III nitride based depletion mode high electron mobility transistor may be an analog high electron mobility transistor. In some embodiments, the Group III nitride based self-bias circuit may further include a current setting circuit that is connected to a source of the first Group III nitride based depletion mode high electron mobility transistor.

Pursuant to further embodiments of the present invention, differential amplifiers are provided that may be used, for example, in the above-described RF transistor amplifier circuits. These differential amplifiers include a differential amplifier stage that includes a plurality of Group III nitride based depletion mode high electron mobility transistors, a level shifter stage that includes a plurality of Group III nitride based depletion mode high electron mobility transistors, an output buffer stage that includes a plurality of Group III nitride based depletion mode high electron mobility transistors, and a current source stage that includes a plurality of Group III nitride based depletion mode high electron mobility transistors. The current source stage may be configured to supply current to each of the differential amplifier stage, the level shifter stage and the output buffer stage.

In some embodiments, the differential amplifier stage may include first, third and fifth Group III nitride based depletion mode high electron mobility transistors that are coupled in series between the current source stage and a power supply voltage and second, fourth and sixth Group III nitride based depletion mode high electron mobility transistors that are coupled in series between the current source stage and a power supply voltage.

In some embodiments, a non-inverting input of the differential amplifier may be coupled to the gate of the first Group III nitride based depletion mode high electron mobility transistor, and an inverting input of the differential amplifier may be coupled to the gate of the second Group III nitride based depletion mode high electron mobility transistor.

In some embodiments, a portion of the current source stage that supplies current to the level shifter stage may be coupled to the level shifter stage through a gate of a transistor in the output buffer stage.

In some embodiments, a first transistor in the level shifter stage may be coupled to a diode of the level shifter stage though a gate of a transistor in the output buffer stage.

Embodiments of the present invention will now be discussed in greater detail with reference to the accompanying figures.

FIG. 1 is block diagram of an RF transistor amplifier circuit 100 according to embodiments of the present invention. As shown in FIG. 1, the RF transistor amplifier circuit 100 includes a self-bias circuit 110, an inverting circuit 120 and an RF transistor amplifier 130 that are all implemented on a common semiconductor die 101. The self-bias circuit 110 may include a first Group III nitride based depletion mode high electron mobility transistor 112 and a current setting circuit 114 that is connected to a terminal (e.g., a source terminal) of the first Group III nitride based depletion mode high electron mobility transistor 112. The current setting circuit 114 may be embodied as a resistor, a current source, a resistor ladder network and/or any other current setting circuit. When embodied using a current source or a resistor ladder network, the current through the first Group III nitride based depletion mode high electron mobility transistor 112 may be programmable. The self-bias circuit 110 is configured to generate a bias voltage that is output at an output 116 of the self-bias circuit 110. The output 116 of the self-bias circuit 110 is coupled to an input of the inverting circuit 120.

The inverting circuit 120 is configured to generate an inverted bias voltage from the bias voltage that is output from the self-bias circuit 110. The inverting circuit 120 may be implemented using a differential amplifier 122, such as an operational amplifier, that has an "inverting" input 124 that is connected to the output 116 of the self-bias circuit 110 and a non-inverting input 126 that is coupled to electrical ground. An output 128 of the differential amplifier is coupled to an input of the RF transistor amplifier 130 and provides the inverted bias voltage to the RF transistor amplifier 130. The differential amplifier 122 may be a unity gain inverting differential amplifier (gain=−1) or may have a gain that is different from unity.

The RF transistor amplifier 130 includes a gate terminal 132 and an RF input terminal 136 that is coupled to the gate terminal 132. The output 128 of the inverting circuit 120 is coupled to the gate terminal 132 of the RF transistor amplifier 130. The RF transistor amplifier 130 includes one or more second Group III nitride based depletion mode high electron mobility transistors 134 that each include a large number of unit cell transistors. If the RF transistor amplifier 130 includes multiple second Group III nitride based depletion mode high electron mobility transistors 134, then the inverted bias voltage that is output by the inverting circuit 120 can be applied to the gate terminal of each second Group III nitride based depletion mode high electron mobility transistor 134 in some embodiments. A terminal of the second Group III nitride based depletion mode high electron mobility transistor 134 may comprise the RF output (RF Out) for the RF transistor amplifier circuit 100, and may output an amplified version of an RF signal that is input at the RF input 136.

The first Group III nitride based depletion mode high electron mobility transistor 112 may be an analog (i.e., non-RF) transistor, and the second Group III nitride based depletion mode high electron mobility transistor 134 may be an RF transistor (i.e., a transistor that is configured to amplify RF transistors). The first Group III nitride based depletion mode high electron mobility transistor 112 may be located on the semiconductor die 101 in relative close proximity to the second Group III nitride based depletion mode high electron mobility transistor 134 so that the first and second depletion mode high electron mobility transistors 112, 134 have substantially the same electrical characteristics, such as the same threshold voltage, and/or substantially the same thermal characteristics. As used herein, "substantially the same" electrical characteristics (e.g., threshold voltage) and/or thermal characteristics means that these characteristics deviate by less than about 5%. However, in some embodiments, these characteristics may deviate by less than about 2% or by less than about 1%. The inverting circuit 120 is also formed on the same semiconductor die 101. The semiconductor die 101 may comprise a wafer (e.g., a semiconductor wafer) that includes one or more semiconductor layers formed thereon in which electrical devices are implemented. In some cases, the entire wafer may form the semiconductor die 101, but more commonly a plurality of devices are formed on a large wafer that is then cut or "diced" into individual die, where each individual die includes an RF transistor amplifier circuit.

Figure 2:
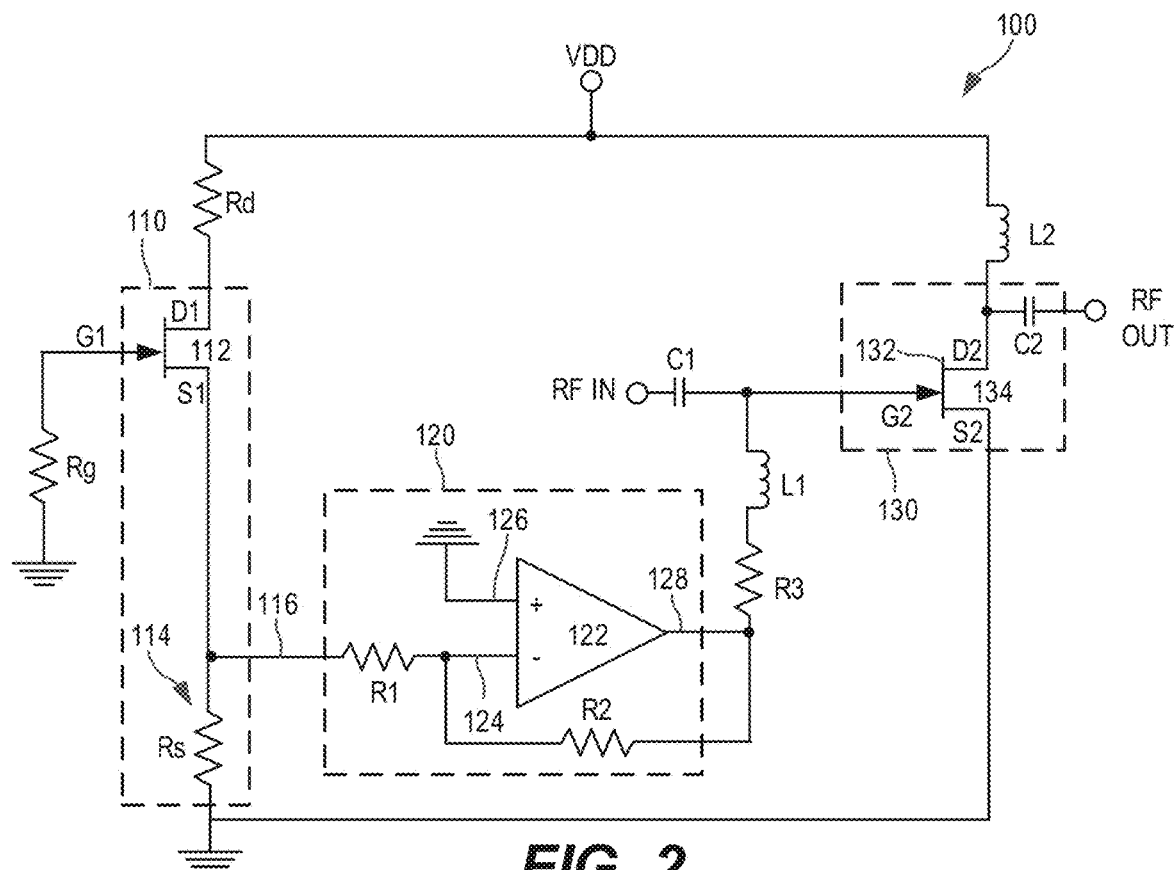
FIG. 2 is a circuit diagram of an RF transistor amplifier circuit according to certain embodiments of the present invention.

FIG. 2 is a circuit diagram of one example implementation of the RF transistor amplifier circuit 100 of FIG. 1. As shown in FIG. 2, the first Group III nitride based depletion mode high electron mobility transistor 112 of the self-bias circuit 110 includes a gate terminal G1 that is coupled to a reference voltage (e.g., a ground voltage), a drain terminal D1 that is coupled to a direct current voltage source VDD, and a source terminal S1 that is coupled to the current setting circuit 114. A gate resistor Rg is coupled between the gate G1 of the first Group III nitride based depletion mode high electron mobility transistor 112 and electrical ground, and a drain resistor Rd is provided between the drain D1 of the first Group III nitride based depletion mode high electron mobility transistor 112 and the power supply voltage VDD. The resistors Rg, Rd can reduce or prevent oscillations in the first Group III nitride based depletion mode high electron mobility transistor 112. The current setting circuit 114 is shown as being implemented as a resistor Rs that is coupled to a reference voltage (e.g., electrical ground). It will be appreciated that other current setting circuits 114 may be used such as, for example, a current sink or a resistor ladder. While the current setting circuit 114 is typically implemented on the semiconductor die 101 to reduce the overall size of the RF transistor amplifier circuit 100, it will be appreciated that in some embodiments the current setting circuit 114 may be implemented off of the semiconductor die 101 (e.g., on a customer printed circuit board) and may be electrically connected to the first Group III nitride based depletion mode high electron mobility transistor 112 by a bond wire or other electrical connection.

The inverting circuit 120 is embodied as a differential amplifier 122, such as an operational amplifier. The differential amplifier includes an inverting input 124 (denoted by a "−" sign in FIG. 2), a non-inverting input 126 (denoted by a "+" sign in FIG. 2), and an output 128. The non-inverting input 126 is connected to a reference voltage, such as electrical ground. The inverting input 124 is connected to the output 116 of the self-bias circuit 110 (which corresponds to the node that connects the source S1 of the first Group III nitride based depletion mode high electron mobility transistor 112 to the current setting circuit 114). First and second resistors R1 and R2 are provided to set the amplification factor of the differential amplifier 122. In some embodiments, the resistance value of R1 may be equal to the resistance value of R2, which sets the inverting differential amplifier 122 to have unity gain.

The output 128 of inverting circuit 120 is connected to the gate terminal 132 (G2) of the RF transistor amplifier 130, which is implemented as a second Group III nitride based depletion mode high electron mobility transistor 134. The RF input (RF IN) for the RF transistor amplifier 130 is also coupled to the gate terminal 132 (G2) of the RF transistor amplifier 130. A first DC blocking capacitor C1 is coupled between the RF input RF IN and the gate terminal 132 of RF transistor amplifier 130 in order to isolate the RF input from the DC gate bias voltage output from the differential amplifier 122. An inductor L1 and/or a resistor R3 are provided between the output 128 of the inverting circuit 120 and the RF input RF IN that form a gate choke that isolates differential amplifier 122 from the RF swing of the RF signals input at the RF input RF IN. The gate choke can be all inductive, all resistive or a combination of inductance and resistance. In other embodiments, a shunt capacitor to electrical ground may be used in place of inductor L1 and resistor R3 to form the gate choke. The drain D2 of the second Group III nitride based depletion mode high electron mobility transistor 134 acts as the RF output for RF transistor amplifier circuit 100. A second DC blocking capacitor C2 is coupled between the RF output RF OUT and the RF transistor amplifier 130. An output choke L2 is also provided that isolates the power supply voltage VDD from the RF output signals. In FIG. 2, all of the illustrated components may be implemented in the common semiconductor die 101.

As discussed above, while differential amplifiers can be formed using Group III nitride based high electron mobility transistors, such differential amplifiers typically include enhancement mode transistors. Enhancement mode transistors are formed differently from depletion mode transistors. It is possible to form both enhancement and depletion mode Group III nitride based high electron mobility transistors on a common die, specifically including depletion mode RF transistors along with analog (non-RF) depletion and enhancement mode transistors, as disclosed in U.S. Pat. No. 10,516,043, the entire content of which is incorporated herein by reference. However, forming both types of transistors on the same die complicates the fabrication process, increasing costs, and may potentially have performance tradeoffs.

The Group III nitride based RF transistor amplifier circuits according to certain embodiments of the present invention include differential amplifiers that are implemented using only a single type of transistor, namely depletion mode high electron mobility transistors. As such, the transistors included in the differential amplifier may be readily formed in the same manufacturing processes that are used to form the differential mode high electron mobility transistors that form the RF transistor amplifiers.

Figure 3:
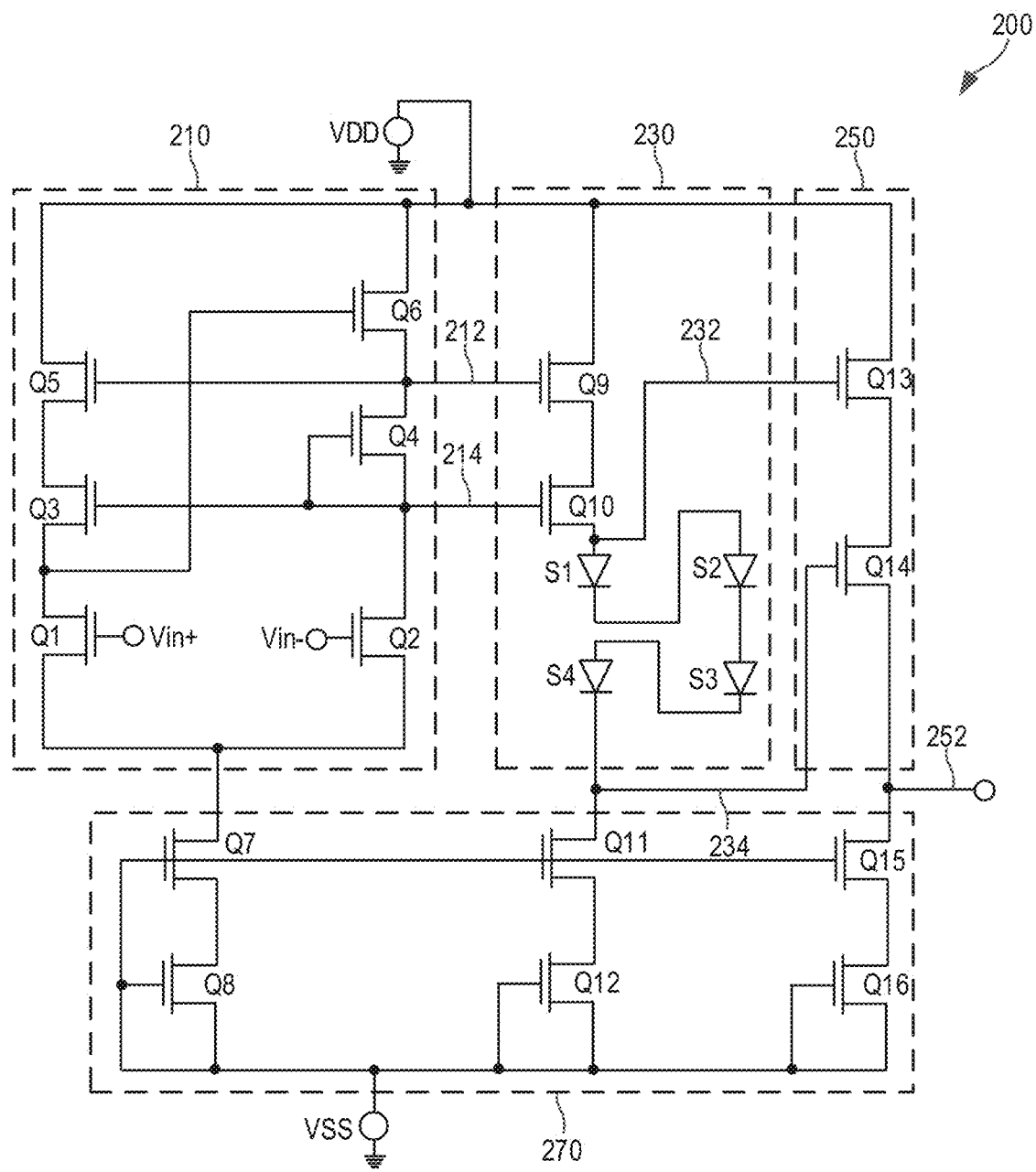
FIG. 3 is a circuit diagram of a differential amplifier according to certain embodiments of the present invention.

FIG. 3 is a circuit diagram of a differential amplifier 200 according to certain embodiments of the present invention that is implemented using only Group III nitride based depletion mode high electron mobility transistors. Herein, differential amplifiers that are implemented using depletion mode high electron mobility transistors without any enhancement mode high electron mobility transistors are referred to as "depletion mode differential amplifiers." Such depletion mode differential amplifiers may include other circuit elements such as, for example, diodes, capacitors, inductors, resistors and the like, but do not include any enhancement mode high electron mobility transistors.

Referring to FIG. 3, the differential amplifier 200 is a depletion mode differential amplifier that includes sixteen Group III nitride based depletion mode high electron mobility transistors. The differential amplifier 200 includes a differential amplifier stage 210, a level shifter stage 230, an output buffer stage 250 and a current source stage 270.

The differential amplifier stage 210 includes six Group III nitride based depletion mode high electron mobility transistors Q1 through Q6. The inputs to differential amplifier 200 are part of the differential amplifier stage 210, and include an inverting input Vin− and a non-inverting input Vin+. The inverting input Vin− is coupled to the gate of depletion mode high electron mobility transistor Q2, while the non-inverting input Vin+ is coupled to the gate of depletion mode high electron mobility transistor Q1. Group III nitride based depletion mode high electron mobility transistors Q3, Q4, Q5 and Q6 are configured as bootstrapped source followers in order to increase both the output impedance and the gain of the differential amplifier stage 210. The differential amplifier stage 210 includes a pair of outputs 212, 214 that are passed to the level shifter 230.

The level shifter stage 230 includes a pair of Group III nitride based depletion mode high electron mobility transistors Q9 and Q10 and a plurality of diodes S1 through S4. The gate of transistor Q9 is coupled to the first output 212 of the differential amplifier stage 210 and the gate of transistor Q10 is coupled to the second output 214 of the differential amplifier stage 210. The level shifter stage 230 is configured to shift the output voltage reference back down to align with the input voltage reference. The diodes S1 through S4 are configured to step down the voltage of a signal passing through the diodes. The number of diodes included may be varied based on the characteristics of the diodes and the voltage step needed. The level shifter stage 230 includes a pair of outputs 232, 234 that are coupled to the output buffer 250.

The output buffer stage 250 includes a pair of Group III nitride based depletion mode high electron mobility transistors Q13 and Q14. The gate of transistor Q13 is coupled to the first output 232 of the level shifter 230 and the gate of transistor Q14 is coupled to the second output 234 of the level shifter 230. Transistors Q13 and Q14 provide current to the output load during device operation.

The current source stage 270 includes six Group III nitride based depletion mode high electron mobility transistors Q7, Q8, Q11, Q12, Q15, Q16 that are implemented as cascode transistors and are sized such that they provide the necessary current to the differential amplifier stage 210, the level shifter stage 230, and the output buffer stage 250. VSS is provided to the source and gate of each of transistors Q8, Q12 and Q16, and is set to provide a negative voltage having a magnitude that is greater than that needed to bias the external RF depletion mode transistor 134 (FIG. 2). VDD is connected to the drain of each of transistors Q5, Q6, Q9 and Q13, and can range in value such that it can be matched to the drain supply voltage used for the external RF depletion mode transistor 134 (FIG. 2). This may reduce or minimize the number of bias supplies that need to be provided to the semiconductor die.

The node between transistors Q14 and Q15 acts as the output 252 for differential amplifier 200.

Figure 4:
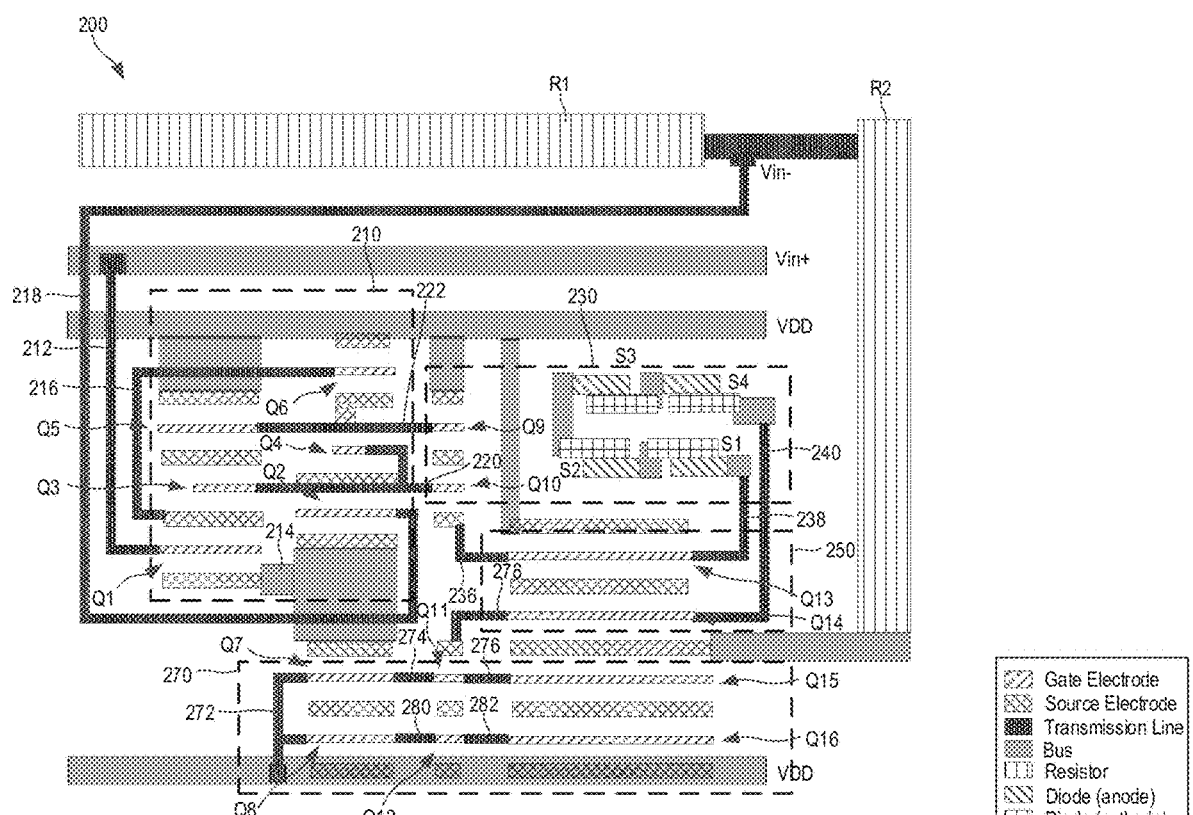
FIG. 4 is a plan view of an example implementation of the RF transistor amplifier circuit of FIG. 3.

FIG. 4 is a plan view of a physical implementation of the differential amplifier 200 of FIG. 3. In particular, FIG. 4 illustrates the metal layers that are formed on the upper surface of a Group III nitride based semiconductor die 201. As shown in FIG. 4, the power supply voltage VDD, the reference voltage VSS and the non-inverting input Vin+ may each be implemented as conductive lines that are formed in a first metal layer on the upper side of the semiconductor die 201. The inverting input Vin− is implemented on a second metal layer so that it can cross the power supply voltage VDD and non-inverting input Vin+ conductive lines.

The differential amplifier stage 210 is implemented in the upper left portion of the semiconductor die 201. The non-inverting input Vin+ is connected to the gate of transistor Q1 by a conductive line 212. The source of transistor Q1 is coupled to a node 214, and the drain of transistor Q1 also acts as the source of transistor Q3. A conductive line 216 connects the drain of transistor Q1 to the gate of transistor Q6. The drain of transistor Q3 acts as the source of transistor Q5. The drain of transistor Q5 is coupled to the power supply voltage VDD.

The inverting input Vin− is connected to the gate of transistor Q2 by a conductive line 218. The source of transistor Q2 is coupled to the node 214, and the drain of transistor Q2 also acts as the source of transistor Q4. A conductive line 220 connects the drain of transistor Q2 to the gates of transistors Q3 and Q4. The drain of transistor Q4 acts as the source of transistor Q6. The drain of transistor Q6 is coupled to the power supply voltage VDD. A conductive line 222 connects the gate of transistor Q5 to the drain of transistor Q4.

The level shifter stage 230 is implemented to the right of the differential amplifier stage 210. The drain of transistor Q4 in the differential amplifier stage 210 is connected to the gate of transistor Q9 in the level shifter stage by the conductive line 222. The drain of transistor Q2 in the differential amplifier stage 210 is connected to the gate of transistor Q10 in the level shifter stage by the conductive line 220. The drain of transistor Q10 acts as the source of transistor Q9. The drain of transistor Q9 is coupled to the power supply voltage VDD. The source of transistor Q10 is coupled to the gate of transistor Q13 in the output buffer stage 250 by a conductive line 236. The source of transistor Q10 is also coupled to a first of four diodes S1-S4 that are arranged electrically in series through the conductive line 236, the gate of transistor Q13, and a conductive line 238. The diodes S1-S4 act to offset the voltage between the source of transistor Q10 and the drain of transistor Q11, thus implementing a voltage level shift such that the output 252 of the differential amplifier 200 is centered at the correct nominal voltage and has sufficient dynamic range in the output voltage swing. The last of the series diodes (diode S4) is connected to the gate of transistor Q14 by a conductive line 240.

The output buffer stage 250 is implemented below the level shifter stage 230. The source of transistor Q13 is coupled to the power supply voltage VDD. The source of transistor Q13 acts as the drain of transistor Q14. The source of transistor Q14 acts as the output terminal for differential amplifier 200.

The current source stage 270 is implemented below the differential amplifier stage 210, the level shifter stage 230 and the output buffer stage 250. The current source stage 270 includes three pairs of cascode transistors that provide each respective stage 210, 230, 250 with the necessary current. The sources of transistors Q8, Q12 and Q16 are shorted to the gates thereof by the reference voltage conductive line VSS. A conductive line 272 electrically connects the reference voltage conductive line VSS to the gate of transistor Q7. A conductive line 274 connects the gate of transistor Q7 to the gate of transistor Q11, and a conductive line 276 connects the gate of transistor Q11 to the gate of transistor Q15. Conductive line 280 electrically connects conductive line VSS to the gate of transistor Q8. A conductive line 280 connects the gate of transistor Q8 to the gate of transistor Q12, and a conductive line 282 connects the gate of transistor Q12 to the gate of transistor Q16. The drain of transistor Q11 is coupled to the gate of transistor Q14 by a conductive line 278.

In FIG. 4, the components are drawn to scale. Thus, for example, it can be seen that the gates of transistors Q13 and Q14 are smaller than the gates of transistors Q15 and Q16 (i.e., the longitudinal dimension of the gates of transistors Q13 and Q14 are smaller than the longitudinal dimension of the gates of transistors Q15 and Q16). As another example, the gates of transistors Q1 and Q2 are each smaller than the gates of any of transistors Q13 through Q16. As another example, the gate of transistor Q6 is smaller than the gate of transistor Q5. As yet another example, the gates of transistors Q9 through Q12 are all smaller than the gates of any of transistors Q5, Q7 and Q8.

While FIGS. 2-4 illustrate an RF transistor amplifier circuit that includes a single stage RF transistor amplifier circuit that is implemented on a discrete semiconductor die, it will be appreciated that embodiments of the present invention are not limited to discrete devices or to single stage amplifiers. For example, FIGS. 5A and 5B illustrate a multi-stage RF transistor amplifier circuit 300 according to embodiments of the present invention that is implemented as a MMIC device.

Figure 5A:
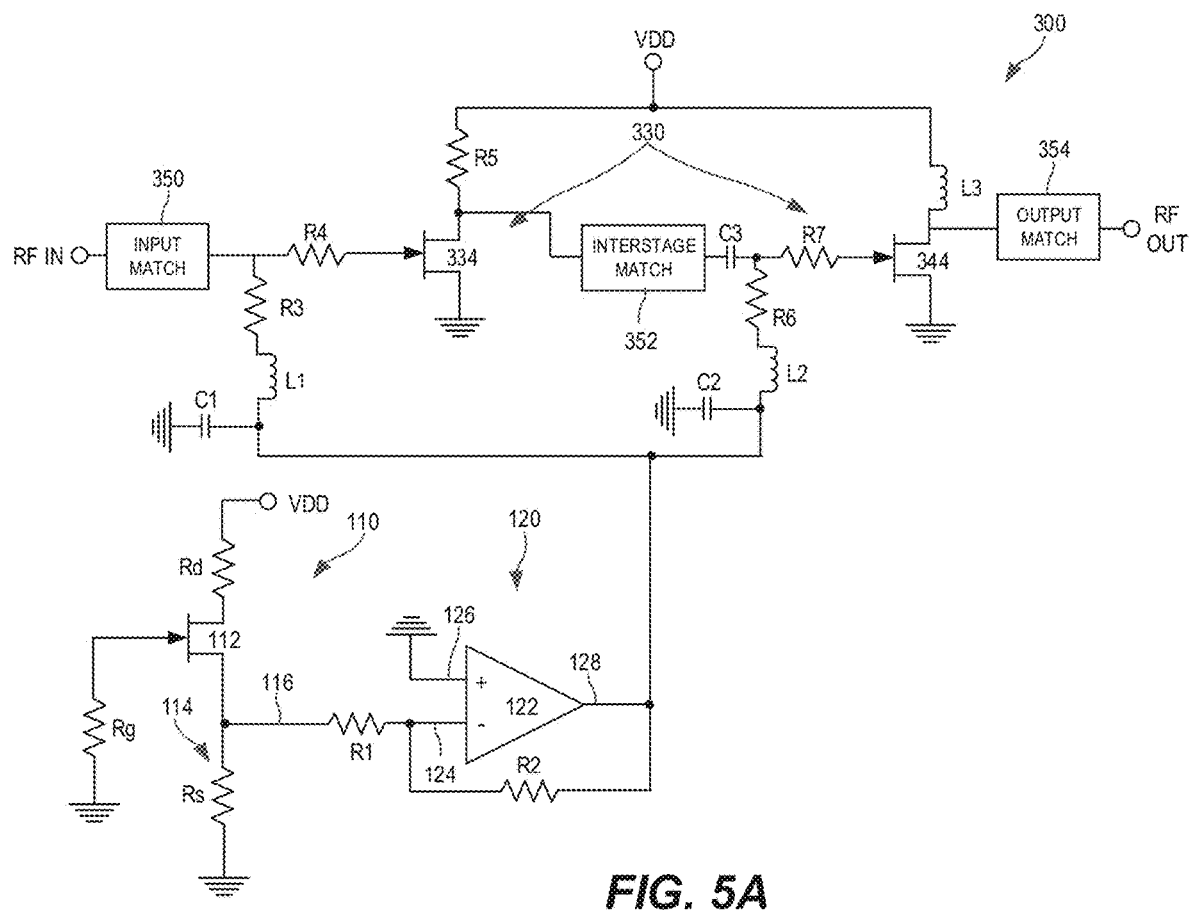
FIG. 5A is a simplified circuit diagram a multi-stage RF transistor amplifier circuit according to embodiments of the present invention that is implemented as a MIMIC device.
Figure 5B:
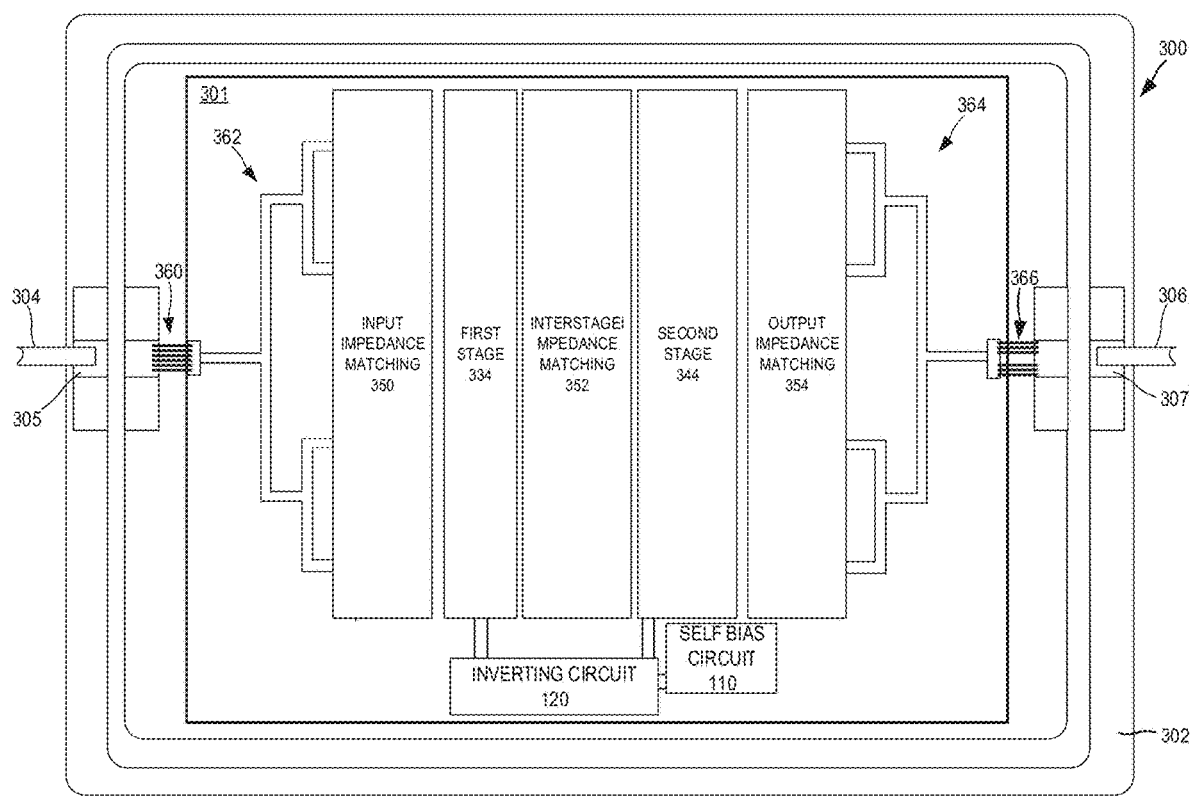
FIG. 5B is a schematic plan view of an example implementation of the RF transistor amplifier circuit of FIG. 5A.

FIG. 5A is a circuit diagram of the RF transistor amplifier circuit 300. As shown in FIG. 5A, the RF transistor amplifier circuit 300 includes a self-bias circuit 110, an inverting circuit 120, and an RF transistor amplifier 330. The self-bias circuit 110 includes a first Group III nitride based depletion mode high electron mobility transistor 112. The self-bias circuit 110 may be identical to self-bias circuit 110 discussed above with reference to FIG. 2, and hence further discussion thereof will be omitted. The inverting circuit 120 may be identical to inverting circuit 120 discussed above with reference to FIG. 2, and hence further discussion thereof will be omitted.

The RF transistor amplifier 330 comprises a multi-stage amplifier that includes a second Group III nitride based depletion mode high electron mobility RF transistor 334 that acts as a pre-amplifier and a third Group III nitride based depletion mode high electron mobility RF transistor 344 that acts as a main amplifier. The output of the inverting circuit 120 is coupled to the gates 332, 342 of the second and third Group III nitride based depletion mode high electron mobility RF transistors 334, 344 in the same manner as shown in FIG. 2 above. The first through third Group III nitride based depletion mode high electron mobility RF transistors 112, 334, 344 may all have similar device properties. As was described above, one way to provide this is to fabricate all three transistors 112, 334, 344 on the same wafer in close proximity to each other.

The output 128 of the inverting circuit 120 is coupled to the gates of the second and third Group III nitride based depletion mode high electron mobility RF transistors 334, 344. Similar to the RF transistor 100 of FIG. 2, a first gate choke in the form of an inductor L1, a capacitor C1 and/or a resistor R3 is provided between the output 128 of the inverting circuit 120 and the RF input RF IN to isolate differential amplifier 122 from the RF swing of the RF signals input at the RF input RF IN. Similarly, a second gate choke in the form of an inductor L2, a capacitor C2 and/or a resistor R6 is provided between the output 128 of the inverting circuit 120 and the gate of the third Group III nitride based depletion mode high electron mobility RF transistor 344 to isolate differential amplifier 122 from the RF swing of the RF signals input to the third Group III nitride based depletion mode high electron mobility RF transistor 344. Resistors R4 and R7 are provided at the gates of the second and third Group III nitride based depletion mode high electron mobility RF transistors 334, 344 to improve RF matching and circuit stability. An output choke L3 is also provided that isolates the power supply voltage VDD from the RF output signals, and a resistor R5 similarly isolates the power supply voltage VDD that is supplied to the first stage from RF signals, and also reduces feedback between the RF stages of the amplifier. A DC blocking capacitor C3 is also provided.

The RF transistor amplifier 330 further includes an input matching circuit 350, an interstage matching circuit 352 and an output matching circuit 354. The matching circuits 350, 352, 354 may perform impedance transformation and/or harmonic terminations using passive components such as capacitors and/or inductors. The matching circuits 350, 352, 354 may be implemented in many different ways, with the topologies depending on a variety of factors including frequency, bandwidth, device characteristics, device sizes, impedance and/or desired performance parameters. For example, the input matching circuit 350 may be embodied by a single inductor or two series connected capacitors with a grounded inductor between them. The interstage matching circuit 352 may be embodied by an inductor with a grounded capacitor at one end and a second inductor and capacitor serially connected between the other end and ground. More complex resistor/capacitor/inductor interstage matching circuits 352 may alternatively be used. The output matching circuit 354 may be embodied by an inductor serially connected between the stages and a capacitor at either end of the inductor that is connected to ground. More complex networks of inductors and capacitors may also be provided. The transistors and associated matching circuits may also be configured in a distributed configuration for some or all of the individual stages.

While FIG. 5A illustrates the self-bias circuit 110 and inverting circuit 120 being used to provide the gate bias voltage to both the pre-amplifier 334 and the main amplifier 344, it will be appreciated that embodiments of the present invention are not limited thereto. For example, in other embodiments, a first self-bias circuit 110 and a first inverting circuit 120 may be provided that generate a first gate bias voltage that is provided to the gate of the pre-amplifier 334 and a second self-bias circuit 110 and a second inverting circuit 120 may be provided that generate a second gate bias voltage that is provided to the gate of the main amplifier 344. This design allows for independent self-biasing of each amplification stage.

FIG. 5B is a schematic plan view of an example implementation of the RF transistor amplifier circuit 300 of FIG. 5A. As shown in FIG. 5B, the RF transistor amplifier circuit 300 includes a single semiconductor die 301 that is contained within a package 302. The package 302 may comprise a protective housing that surrounds and protects the semiconductor die 301. The package 302 may be formed of, for example, a ceramic material or an overmolded plastic material with a metal or printed circuit board base. The package 302 includes an input lead 304 and an output lead 306. The input lead 304 may be mounted to an input lead pad 305 by, for example, soldering. One or more input bond wires 360 may electrically connect the input lead pad 305 to an input bond pad on the semiconductor die 301.

The RF transistor amplifier circuit 300 includes an input feed network 362, an input impedance matching network 350, a first RF transistor amplifier stage 334, an intermediate impedance matching network 352, a second RF transistor amplifier stage 344, an output impedance matching stage 354, and an output feed network 364. The output lead 306 is connected to an output lead pad 307 by, for example, soldering. One or more output bond wires 366 may electrically connect the output lead pad 307 to an output bond pad on the semiconductor die 301.

As is further shown in FIG. 5B, the self-bias circuit 110 and the inverting circuit 120 are formed on the semiconductor die 301. The self-bias circuit 110 may generate a bias voltage and provide the bias voltage to the inverting circuit 120. The inverting circuit 120 may invert the bias voltage received from the self-bias circuit 110 and provide the inverted bias voltage to the gates of the first and second stage RF transistor amplifiers 334, 344.

While FIGS. 5A-5B depict an RF transistor amplifier circuit 300 that includes two RF stages embodied as RF transistor amplifiers 334, 344 connected to the same self-bias and inverting circuits 110, 120, it will be appreciated that one or three or more RF stages may also be connected to the same self-bias and inverting circuits 110, 120 in other embodiments.

Figure 6:
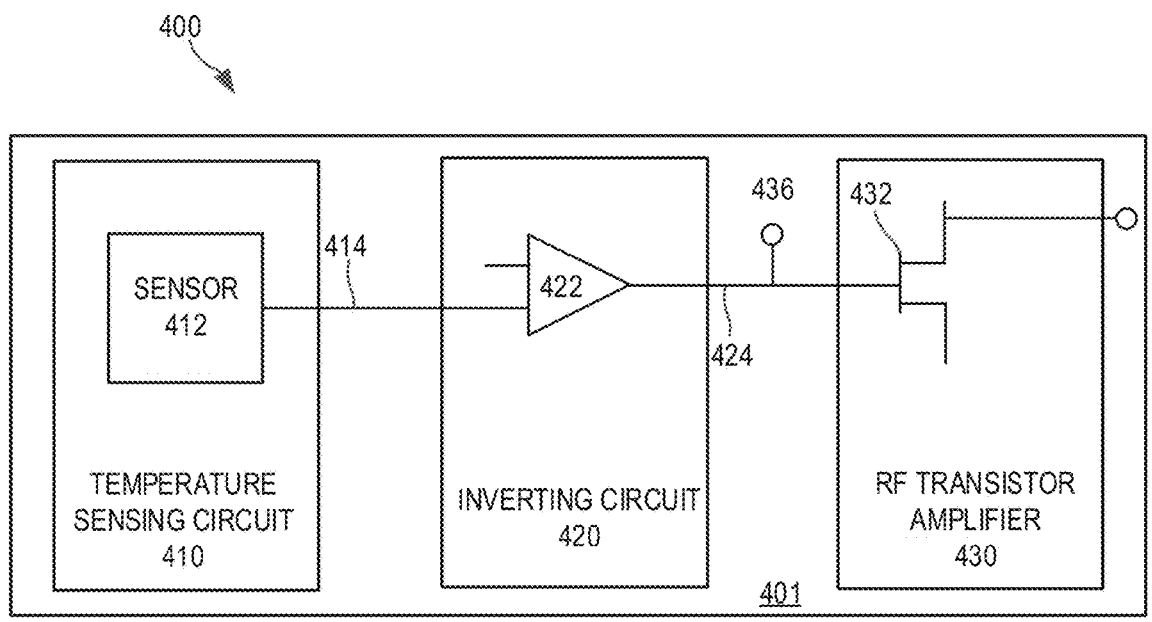
FIG. 6 is a schematic block diagram of an RF transistor amplifier circuit according to embodiments of the present invention that includes a temperature control circuit.

It will be appreciated that the Group III nitride based depletion mode differential amplifiers according to embodiments of the present invention may be used in a wide variety of different applications. For example, FIG. 6 is a schematic block diagram of an RF transistor amplifier circuit 400 that includes a temperature control circuit. The RF transistor amplifier circuit 400 includes a temperature sensing circuit 410, an inverting circuit, and an RF transistor amplifier 430. The temperature sensing circuit 410 includes a temperature sensor 412 (which may comprise, for example, a field effect transistor or a diode). An output 414 of the temperature sensing circuit 410 is coupled to an input of the inverting circuit 420. The inverting circuit 420 may comprise, for example, any of the Group III nitride based depletion mode differential amplifier 422 according to embodiments of the present invention disclosed herein. An output 424 of the inverting circuit 420 may be coupled to the gate 432 of the RF transistor amplifier 430 to shift the gate bias voltage as appropriate in response to changes in temperature. An RF input 436 is also coupled to the gate 432 of the RF transistor amplifier 430.

Figure 7:
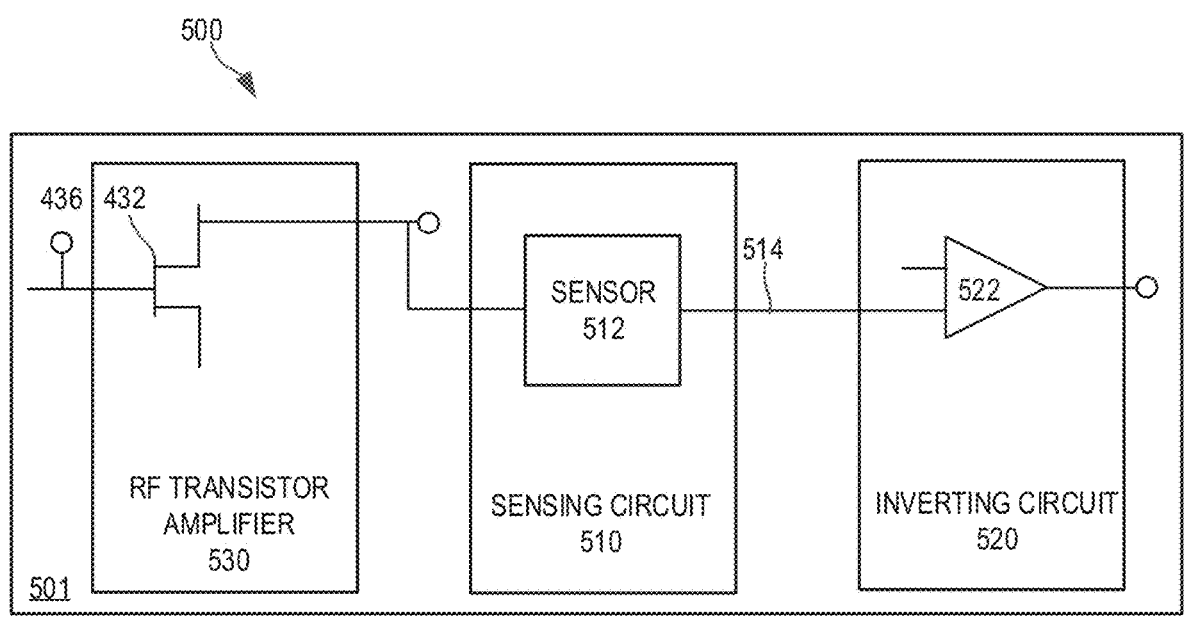
FIG. 7 is a schematic block diagram of an RF transistor amplifier circuit according to embodiments of the present invention that includes a sensing circuit that senses a parameter of an RF output signal.

In still other embodiments, the Group III nitride based depletion mode differential amplifiers according to embodiments of the present invention may be used for sensing characteristics of the RF transistor amplifier 420 such as the amplitude, phase and/or power level of an RF signal output by the RF transistor amplifier 420. FIG. 7 is a schematic block diagram of an RF transistor amplifier circuit 500 that includes such a sensing circuit. The RF transistor amplifier circuit 500 includes an RF transistor amplifier 530 and an amplitude, phase or power sensing circuit 510 that senses a parameter of the RF signal output by the RF transistor amplifier 530. The output 514 of the sensor circuit 510 is provided to an inverting circuit 520. An output of the inverting circuit may be used for any suitable purpose such as, for example, adjusting RF or bias inputs to the to the RF transistor amplifier 530 or for adjusting other circuits in a larger RF system.

Figure 8A:
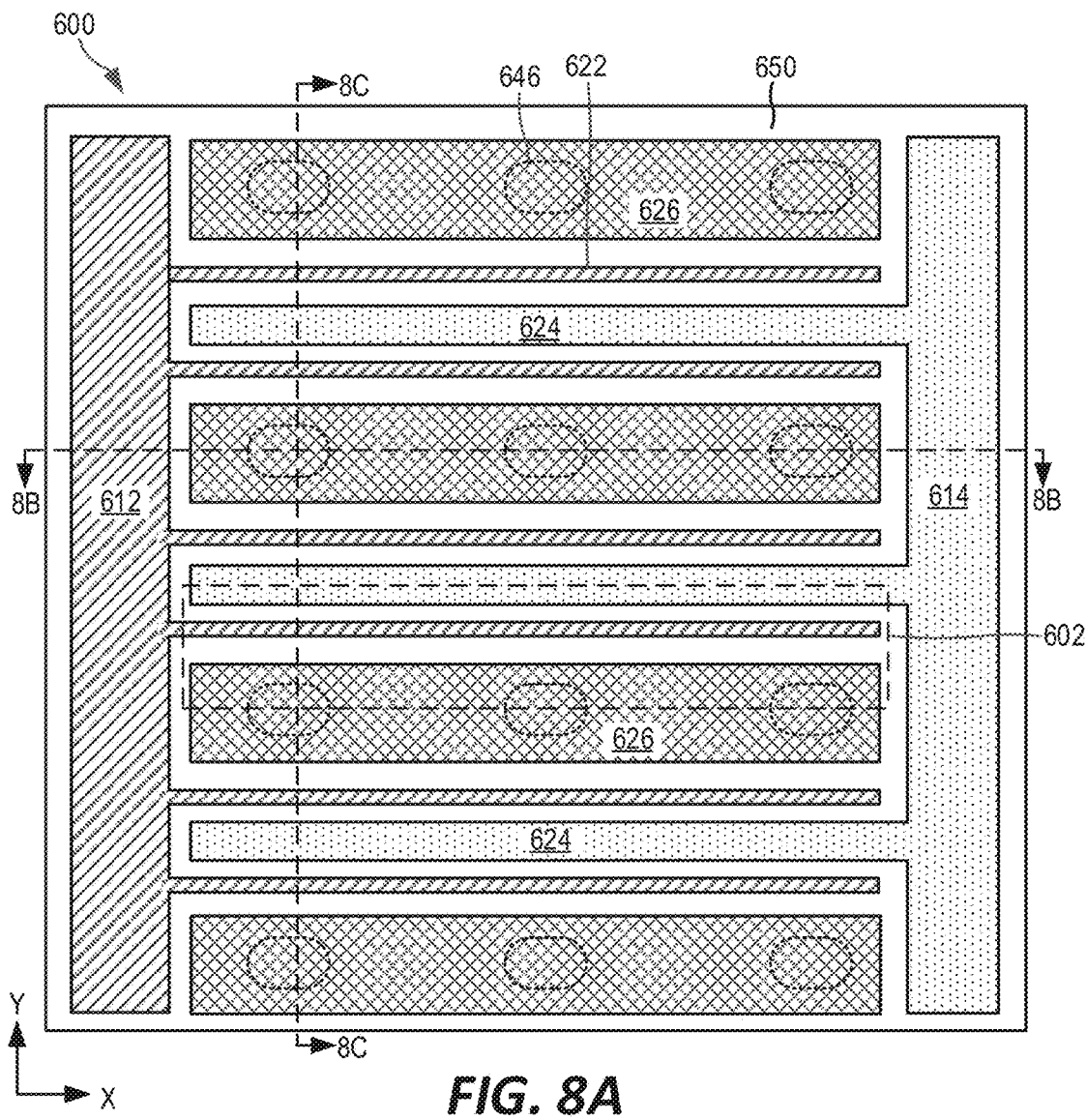
FIG. 8A is a schematic plan view of a Group III nitride-based RF transistor amplifier that may be used in the RF transistor amplifier circuits according to embodiments of the present invention.
Figure 8B:
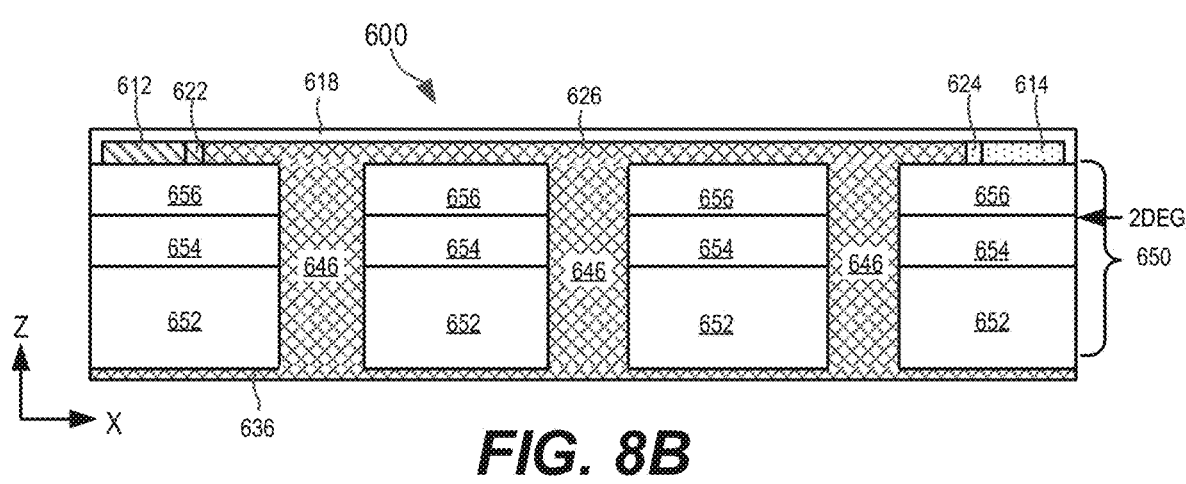
FIG. 8B is a schematic cross-sectional view taken along line 8B-8B of FIG. 8A.
Figure 8C:
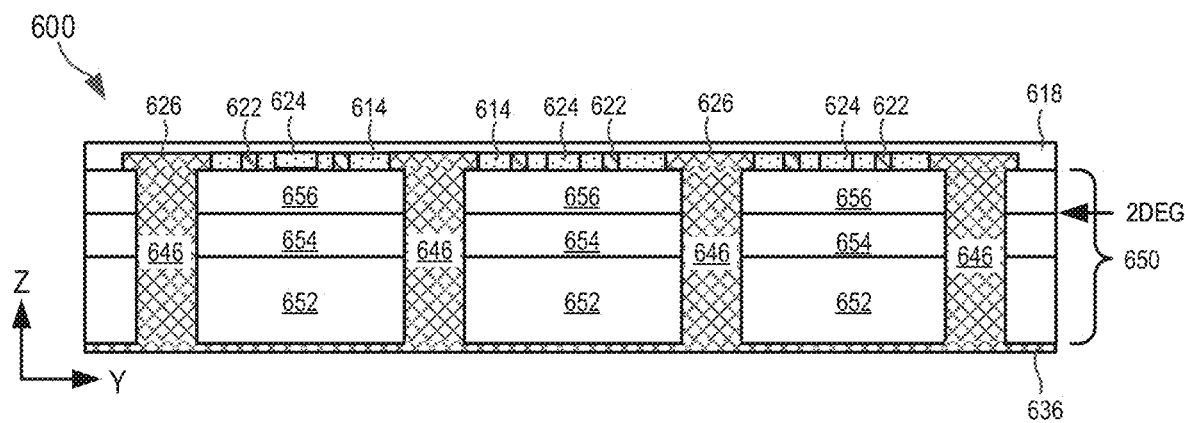
FIG. 8C is a schematic cross-sectional view taken along line 8C-8C of FIG. 8A.

The RF transistor amplifiers included in the RF transistor amplifier circuits according to embodiments of the present invention may have any appropriate design. FIGS. 8A through 8C are various views that schematically illustrate a Group III nitride based depletion mode high electron mobility RF transistor amplifier 600 that may be used to implement any of the RF transistor amplifiers discussed above. In particular, FIG. 8A is a schematic plan view of the RF transistor amplifier 600. In FIG. 8A, most of the metallization that is on the top surface of the semiconductor layer structure has been removed to illustrate the metallization that directly contacts a semiconductor layer structure of RF transistor amplifier 600. FIGS. 8B and 8C are schematic cross-sectional views of the RF transistor amplifier 600 taken along lines 8B-8B and 8C-8C of FIG. 8A, respectively. It will be appreciated that FIGS. 8A-8C are highly simplified diagrams that only illustrate a few unit cells.

As shown in FIG. 8A, the RF transistor amplifier 600 includes a ate bus 612, a drain bus 614, a plurality of gate fingers 622, a plurality of drain fingers 624 and a plurality of source fingers 626, all of which are formed on an upper surface of a semiconductor layer structure 650. The gate fingers 622, drain fingers 624 and source fingers 626 may extend in parallel to each other, with the gate fingers 622 extending from the gate bus 612 in a first direction and the drain fingers 624 extending from the drain bus 614 in a direction opposite the first direction. Each gate finger 622 may be positioned between a drain finger 614 and a source finger 626.

The gate bus 612 and the gate fingers 622 may be implemented as a first monolithic metal pattern. The gate bus 612 and the gate fingers 622 are part of a gate electrode structure of the RF transistor amplifier 600. The upper portion (not shown) of the gate electrode may act as the gate terminal 632 of the RF transistor amplifier 600. A first circuit element (not shown) may be connected to the gate terminal 632 by, for example, bond wires (not shown). The first circuit element may pass an input RF signal that is to be amplified to the RF transistor amplifier 600.

Figure 9A:
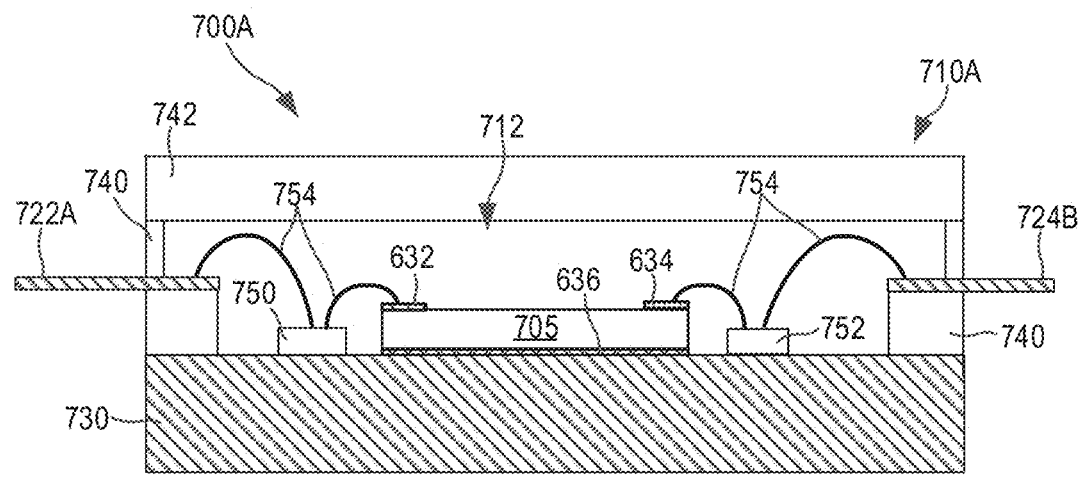
FIGS. 9A through 9C are schematic cross-sectional views illustrating several example ways that that the RF transistor amplifier circuits according to embodiments of the present invention may be packaged to provide packaged RF transistor amplifier circuits.

The drain bus 614 and the drain fingers 624 may be implemented as a second monolithic metal pattern. The drain bus 614 and the drain fingers 624 are part of a drain electrode of the RF transistor amplifier 600. The upper portion (not shown) of the drain electrode may act as a drain terminal 634 of the RF transistor amplifier 600. A second circuit element (not shown) may be connected to the drain terminal 634 by, for example, bond wires (not shown). The second circuit element may receive an amplified RF signal that is output by the RF transistor amplifier 600. The gate and drain terminals 632, 634 are not shown in FIG. 8A, but are schematically depicted in FIG. 9A.

The source fingers 626 are physically and electrically connected to a source terminal 636 (see FIG. 9A) of the RF transistor amplifier 600 that is located on the bottom side of the semiconductor layer structure 650 by a plurality of metal-plated (or metal-filled) source vias 146. Each metal-plated source via 646 may extend through the semiconductor layer structure 650.

One or more interlayer insulating layers 618 (see FIG. 8B) are formed that isolate the gate metallization 612, 622, the drain metallization 614, 624 and the source metallization 626 from each other. The interlayer insulating layer(s) 618 may include a dielectric material, such as SiN, $SiO_2$, etc.

The RF transistor amplifier 600 includes a plurality of unit cell transistors 602, one of which is indicated in the dashed box in FIG. 8A. The unit cell transistor 602 includes a gate finger 622, a portion of a drain finger 624 and a portion of a source finger 626 along with the portions of the semiconductor layer structure 650 underlying the identified gate finger 122, drain finger 624 and source finger 626. Since all of the gate fingers 622 are electrically connected to a common gate bus 612, all of the drain fingers 624 are electrically connected to a common drain bus 614, and all of the source fingers 626 are electrically connected to a common source terminal 636, it can be seen that the unit cell transistors 602 are all electrically connected together in parallel.

FIGS. 8B and 8C illustrate the semiconductor layer structure 650 in more detail. As shown in FIGS. 8B and 8C, the semiconductor layer structure 650 includes a channel layer 654 and a barrier layer 656 that is on a top side of the channel layer 654. The semiconductor layer structure 650 may (and typically will) include additional semiconductor and/or non-semiconductor layers. For example, the semiconductor layer structure 650 may include a growth substrate 652 on which the other semiconductor layers are grown. The growth substrate 652 may comprise, for example, a 4H-SiC or 6H-SiC substrate. In other embodiments, the growth substrate 652 may be comprise a different semiconductor material (e.g., silicon or a Group III nitride-based material) or a non-semiconductor material. Optional buffer, nucleation, strain balancing, transition and/or other layers (not shown) may be provided within the semiconductor layer structure 650.

In some embodiments, the channel layer 654 is a Group III nitride based material, such as $Al_xGa_{1-x}N$ where $0 \leq x < 1$, provided that the energy of the conduction band edge of the channel layer 654 is less than the energy of the conduction band edge of the barrier layer 656 at the interface between the channel and barrier layers 654, 656. The channel layer 654 may also be other Group III nitrides such as InGaN, AlInGaN or the like. The channel layer 654 may be undoped or unintentionally doped and may be grown to a thickness of, for example, greater than about 20 Å. The channel layer 654 may also be a multi-layer structure, such as a superlattice or combinations of GaN, AlGaN or the like.

The channel layer 654 may have a bandgap that is less than the bandgap of at least a portion of the barrier layer 656, and the channel layer 654 may also have a larger electron affinity than the barrier layer 656.

The barrier layer 656 may be a Group III nitride and may have a bandgap larger than that of the channel layer 654 and a smaller electron affinity than the channel layer 654. Accordingly, in certain embodiments of the present invention, the barrier layer 656 may include AlGaN, AlInGaN and/or AlN or combinations of layers thereof. The barrier layer 656 may, for example, be from about 0.1 nm to about 30 nm thick. In particular embodiments, the barrier layer 656 is thick enough and has a high enough Al composition and doping to induce a significant carrier concentration at the interface between the channel layer 654 and the barrier layer 656. In certain embodiments, the barrier layer 656 is undoped or doped with an n-type dopant to a concentration less than about $10^{19}$ $cm^{-3}$. In some embodiments of the present invention, the barrier layer 656 is $Al_xGa_{1-x}N$ where $0 < x < 1$. In particular embodiments, the barrier layer 656 comprises AlGaN with an aluminum concentration of between about 5% and about 100%.

Due to the difference in bandgap between the barrier layer 656 and the channel layer 654 and piezoelectric effects at the interface between the barrier layer 656 and the channel layer 654, a two dimensional electron gas (2DEG) is induced in the channel layer 654 at a junction between the channel layer 654 and the barrier layer 656. The 2DEG acts as a highly conductive layer that allows conduction between the source region of each unit cell transistor 602 and its associated drain region, where the source region is the portion of the semiconductor layer structure 650 that is directly underneath the source finger 626 and the drain region is the portion of the semiconductor layer structure 650 that is directly underneath the corresponding drain finger 624.

Figure 9B:
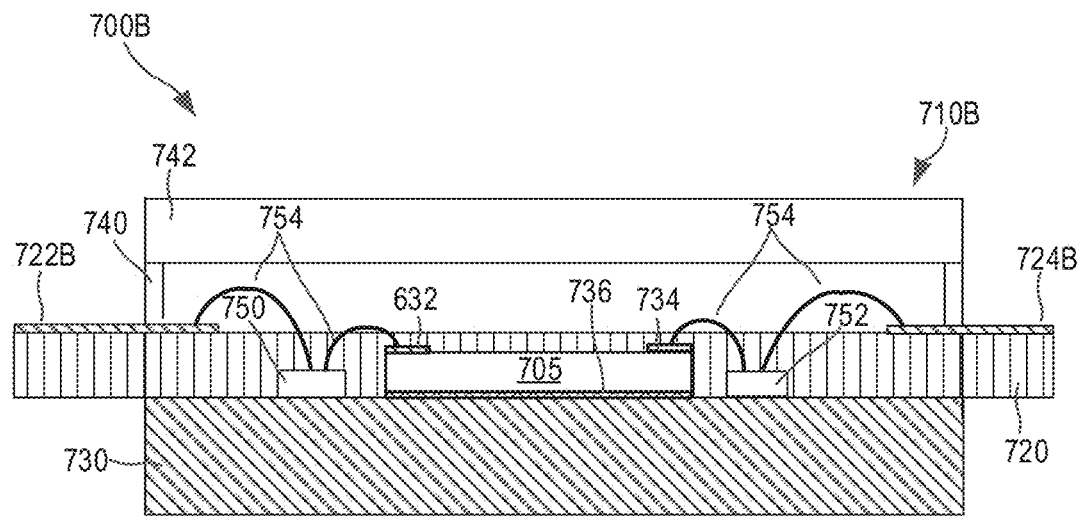
Figure 9C:
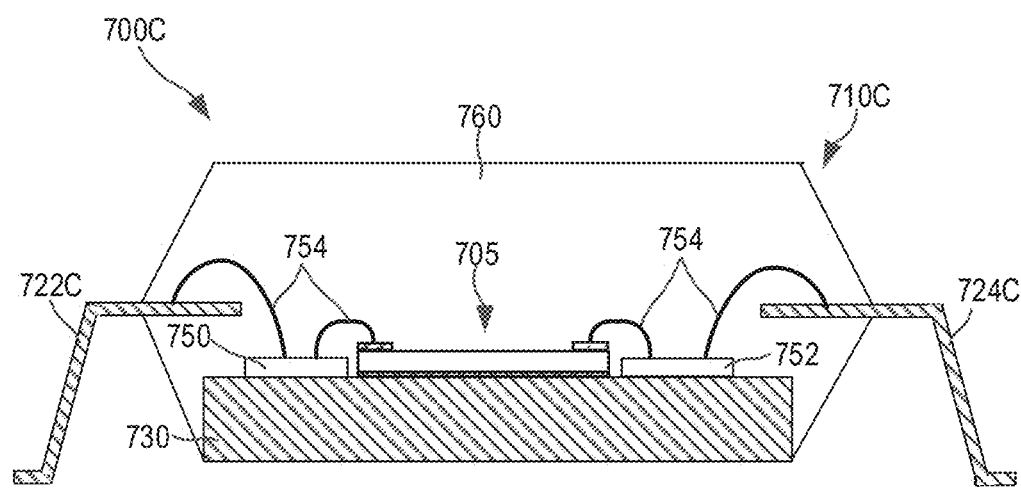

FIGS. 9A through 9C are schematic cross-sectional views illustrating several example ways that that the RF transistor amplifier circuits according to embodiments of the present invention may be packaged to provide packaged RF transistor amplifier circuits 700A through 700C, respectively. Any of the RF transistor amplifier circuits according to embodiments of the present invention may be packaged in the packages illustrated in FIGS. 9A-9C.

FIG. 9A is a schematic side view of a packaged Group III nitride-based RF transistor amplifier circuit 700A. As shown in FIG. 9A, packaged RF transistor amplifier circuit 700A includes an RF transistor amplifier circuit 705 according to embodiments of the present invention packaged in an open cavity package 710A. The package 710A includes metal gate leads 722A, metal drain leads 724A, a metal submount 730, sidewalls 740 and a lid 742.

The submount 730 may include materials configured to assist with the thermal management of the package 700A. For example, the submount 730 may include copper and/or molybdenum. In some embodiments, the submount 730 may be composed of multiple layers and/or contain vias/interconnects. In an example embodiment, the submount 730 may be a multilayer copper/molybdenum/copper metal flange that comprises a core molybdenum layer with copper cladding layers on either major surface thereof. In some embodiments, the submount 730 may include a metal heat sink that is part of a lead frame or metal slug. The sidewalls 740 and/or lid 742 may be formed of or include an insulating material in some embodiments. For example, the sidewalls 740 and/or lid 742 may be formed of or include ceramic materials. In some embodiments, the sidewalls 740 and/or lid 742 may be formed of, for example, $Al_2O_3$. The lid 742 may be glued to the sidewalls 740 using an epoxy glue. The sidewalls 740 may be attached to the submount 730 via, for example, brazing. The gate lead 722A and the drain lead 724A may be configured to extend through the sidewalls 742, though embodiments of the present invention are not limited thereto.

The RF transistor amplifier circuit 705 is mounted on the upper surface of the metal submount 730 in an air-filled cavity 712 defined by the metal submount 730, the ceramic sidewalls 740 and the ceramic lid 742. As described above, the gate terminal 632 and drain terminal 634 of the RF transistor amplifier circuit 705 may be on the top side of the semiconductor die, while the source terminal 636 may be the bottom side of the semiconductor die. The source terminal 636 may be mounted on the metal submount 730 using, for example, a conductive die attach material (not shown). The metal submount 730 may provide the electrical connection to the source terminal 636.

If the RF transistor amplifier circuit 705 is a MMIC device, then any matching circuits may be included within the RF transistor amplifier circuit 705. If the RF transistor amplifier circuit 705 instead is a discrete device, then input matching circuits 750 and/or output matching circuits 752 may also be mounted within the package 710, as shown in FIG. 9A. The matching circuits 750, 752 may include impedance matching and/or harmonic termination circuits. As schematically shown in FIG. 9A, the input and output matching circuits 750, 752 may be mounted on the metal submount 730. The gate lead 722A may be connected to the input matching circuit 750 by one or more bond wires 754, and the input matching circuit 750 may be connected to the gate terminal of RF transistor amplifier circuit 705 by one or more additional bond wires 754. Similarly, the drain lead 724A may be connected to the output matching circuit 752 by one or more bond wires 754, and the output matching circuit 752 may be connected to the drain terminal of RF transistor amplifier circuit 705 by one or more additional bond wires 754. The bond wires 754, which are inductive elements, may form part of the input and/or output matching circuits.

FIG. 9B is a schematic side view of a packaged Group III nitride-based RF transistor amplifier circuit 200B that includes an RF transistor amplifier circuit 705, which may be any of the RF transistor amplifier circuits disclosed herein. The packaged RF transistor amplifier circuit 700B is very similar to the packaged RF transistor amplifier circuit 700A of FIG. 9A, except that the gate and drain leads 722A, 724A of package 710A are replaced with printed circuit board based leads 722B, 724B in package 710B.

The package 710B includes a submount 730, ceramic sidewalls 740, a ceramic lid 742, each of which may be substantially identical to the like numbered elements of package 710A discussed above. The package 710B further includes a printed circuit board 720. Conductive traces on the printed circuit board 720 form a metal gate lead 722B and a metal drain lead 724B. The printed circuit board 720 may be attached to the submount 730 via, for example, a conductive glue. The printed circuit board 730 includes a central opening and the RF transistor amplifier circuit 705 is mounted within this opening on the submount 730. Other components of RF transistor amplifier circuit 700B may be the same as the like-numbered components of RF transistor amplifier 200A, and hence further description thereof will be omitted.

FIG. 9C is a schematic side view of another packaged Group III nitride-based RF transistor amplifier circuit 700C. RF transistor amplifier circuit 700C differs from RF transistor amplifier circuit 700A in that it includes a different package 710C. The package 710C includes a metal submount 730, as well as metal gate and drain leads 722C, 724C. RF transistor amplifier circuit 700C also includes a plastic overmold 760 that at least partially surrounds the RF transistor amplifier circuit 705, the leads 722C, 724C, and the metal submount 730. Other components of RF transistor amplifier circuit 700C may be the same as the like-numbered components of RF transistor amplifier circuit 700A and hence further description thereof will be omitted.

While the embodiments of the present invention discussed above include differential amplifiers that are implemented solely with depletion mode Group III nitride based transistors, it will be appreciated that in other embodiments, the differential amplifiers may include both depletion mode and enhancement mode Group III nitride based transistors. Such differential amplifiers could be implemented, for example, using the techniques disclosed in the above referenced U.S. Pat. No. 10,516,043. While the processing required to form such differential amplifiers may be more complicated and costly, a fully integrated (i.e., formed on a single die) RF transistor amplifier circuit that included a depletion mode Group III nitride based RF transistor amplifier, a self-bias circuit and a Group III nitride based differential amplifier formed using a combination of Group III nitride based depletion mode and enhancement mode transistors could provide performance improvements, such as significantly reduced power usage.

The RF transistor amplifier circuits according to embodiments of the present invention may be designed to operate in a wide variety of different frequency bands. In some embodiments, the RF transistor amplifiers may be configured to operate at frequencies greater than 1 GHz. In other embodiments, these RF transistor amplifier circuits may be configured to operate at frequencies greater than 2.5 GHz. In still other embodiments, the RF transistor amplifier circuits may be configured to operate at frequencies greater than 3.1 GHz. In yet additional embodiments, these RF transistor amplifier circuits may be configured to operate at frequencies greater than 5 GHz. In some embodiments, these RF transistor amplifier circuits may be configured to operate in at least one of the 2.5-2.7 GHz, 3.4-4.2 GHz, 5.1-5.8 GHz, 12-18 GHz, 18-27 GHz, 27-40 GHz or 40-75 GHz frequency bands or sub-portions thereof.

Embodiments of the present invention have been described above with reference to the accompanying drawings, in which embodiments of the invention are shown. This inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the terms "comprises" "comprising," "includes" and/or "including" specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A radio frequency ("RF") transistor amplifier circuit, comprising:
   a Group III nitride based RF transistor amplifier having a gate terminal;
   a Group III nitride based self-bias circuit that includes a first Group III nitride based depletion mode high electron mobility transistor, the Group III nitride based self-bias circuit configured to generate a bias voltage; and
   a Group III nitride based depletion mode differential amplifier that is configured to generate an inverted bias voltage from the bias voltage and to apply the inverted bias voltage to the gate terminal of the Group III nitride based RF transistor amplifier,
   wherein the Group III nitride based depletion mode differential amplifier comprises a differential amplifier stage, a level shifter stage, an output buffer stage, and a current source stage, and
   wherein the Group III nitride based RF transistor amplifier, the Group III nitride based self-bias circuit and the Group III nitride based depletion mode differential amplifier are all implemented in a single die.

2. The RF transistor amplifier circuit of claim 1, wherein the Group III nitride based RF transistor amplifier includes a second Group III nitride based depletion mode high electron mobility transistor, and wherein the first and second Group III nitride based depletion mode high electron mobility transistors have substantially the same threshold voltage.

3. The RF transistor amplifier circuit of claim 2, wherein the differential amplifier has an inverting input that is coupled to an output of the self-bias circuit and an output that is coupled to a gate of the second Group III nitride based depletion mode high electron mobility transistor.

4. The RF transistor amplifier circuit of claim 3, wherein the Group III nitride based RF transistor amplifier further includes a third Group III nitride based depletion mode high electron mobility transistor, and wherein the output of the self-bias circuit is also connected to a gate of the third Group III nitride based depletion mode high electron mobility transistor.

5. The RF transistor amplifier of claim 2, wherein the self-bias circuit is configured to mirror a current in the second Group III nitride based depletion mode high electron mobility transistor and to provide a bias voltage to the gate of the second Group III nitride based depletion mode high electron mobility transistor based on the current that is mirrored.

6. The RF transistor amplifier of claim 2, further comprising an RF input terminal that is connected to the gate of the second Group III nitride based depletion mode high electron mobility transistor.

7. The RF transistor amplifier circuit of claim 1, wherein the Group III nitride based depletion mode differential amplifier includes an RF depletion mode high electron mobility transistor and the first Group III nitride based depletion mode high electron mobility transistor comprises an analog high electron mobility transistor.

8. The RF transistor amplifier circuit of claim 1, wherein a gate of the first Group III nitride based depletion mode high electron mobility transistor is coupled to a reference voltage.

9. The RF transistor amplifier circuit of claim 1, wherein the Group III nitride based self-bias circuit further includes a current setting circuit that is connected to a source of the first Group III nitride based depletion mode high electron mobility transistor.

10. The RF transistor amplifier circuit of claim 1, wherein the Group III nitride based depletion mode differential amplifier is a unity gain differential amplifier.

11. A differential amplifier, comprising:
    a differential amplifier stage that includes a plurality of Group III nitride based depletion mode high electron mobility transistors;
    a level shifter stage that includes a plurality of Group III nitride based depletion mode high electron mobility transistors;
    an output buffer stage that includes a plurality of Group III nitride based depletion mode high electron mobility transistors; and
    a current source stage that includes a plurality of Group III nitride based depletion mode high electron mobility transistors that are configured to supply current to the level shifter stage.

12. The differential amplifier of claim 11, wherein the plurality of Group III nitride based depletion mode high electron mobility transistors of the current source stage are configured to supply current to the differential amplifier stage and the output buffer stage.

13. The differential amplifier of claim 11, wherein the plurality of Group III nitride based depletion mode high electron mobility transistors in the differential amplifier stage comprise first, third and fifth Group III nitride based depletion mode high electron mobility transistors that are coupled in series between the current source stage and a power supply voltage and second, fourth and sixth Group III nitride based depletion mode high electron mobility transistors that are coupled in series between the current source stage and the power supply voltage.

14. The differential amplifier of claim 13, wherein a non-inverting input of the differential amplifier is coupled to the gate of the first Group III nitride based depletion mode high electron mobility transistor, and an inverting input of the differential amplifier is coupled to the gate of the second Group III nitride based depletion mode high electron mobility transistor.

15. The differential amplifier of claim 11, wherein a portion of the current source stage that supplies current to the level shifter stage is coupled to the level shifter stage through a gate of a transistor in the output buffer stage.

16. The differential amplifier of claim 11, wherein a first transistor in the level shifter stage is coupled to a diode of the level shifter stage though a gate of a transistor in the output buffer stage.

17. The differential amplifier of claim 11, in combination with a Group III nitride based self-bias circuit and a Group III nitride based RF transistor amplifier, wherein the Group III nitride based self-bias circuit, the differential amplifier and the Group III nitride based RF transistor amplifier are formed on a common semiconductor die.

18. The differential amplifier of claim 17, wherein the Group III nitride based self-bias circuit includes a first Group III nitride based depletion mode high electron mobility transistor, the Group III nitride based self-bias circuit is configured to generate a bias voltage, and the differential amplifier is configured to generate an inverted bias voltage from the bias voltage and to apply the inverted bias voltage to a gate terminal of the Group III nitride based RF transistor amplifier that includes a second Group III nitride based depletion mode high electron mobility transistor.

19. The differential amplifier of claim 18, wherein the first and second Group III nitride based depletion mode high electron mobility transistors have substantially the same threshold voltage.

20. The differential amplifier of claim 19, wherein the differential amplifier has an inverting input that is coupled to an output of the self-bias circuit and an output that is coupled to a gate of the second Group III nitride based depletion mode high electron mobility transistor.

* * * * *